(12) United States Patent
Yu

(10) Patent No.: US 6,184,809 B1
(45) Date of Patent: Feb. 6, 2001

(54) USER TRANSPARENT SELF-CALIBRATION TECHNIQUE FOR PIPELINED ADC ARCHITECTURE

(75) Inventor: Paul C. Yu, Irving, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/241,879

(22) Filed: Feb. 1, 1999

Related U.S. Application Data

(60) Provisional application No. 60/097,278, filed on Aug. 19, 1998.

(51) Int. Cl.[7] .............................. H03M 1/10; H03M 1/12
(52) U.S. Cl. ............................................ 341/120; 341/155
(58) Field of Search ..................................... 341/120, 155, 341/113, 145, 122, 124

(56) References Cited

U.S. PATENT DOCUMENTS

| | | | | |
|---|---|---|---|---|
| 5,499,027 | * | 3/1996 | Karanicolas et al. ................. | 341/120 |
| 5,510,789 | | 4/1996 | Lee ....................................... | 341/120 |
| 5,929,796 | * | 7/1999 | Opris et al. ........................... | 341/120 |

OTHER PUBLICATIONS

Lin et al., "A 13–b 2.5–MHz Self–Calibrated Pipelined A/D Converter in 3–μm CMOS," *IEEE Journal of Solid–State Circuits*, vol. 26, No. 4, Apr. 1991, pp. 628–636.

Lee, "A 12–b 600 ks/s Digitally Self–Calibrated Pipelined Algorithmic ADC," *IEEE Journal of Solid–State Circuits*, vol. 29, No. 4, Apr. 1994, pp. 509–515.

Shu et al., "A 13–b 10–Msample/s ADC Digitally Calibrated with Oversampling Delta–Sigma Converter," *IEEE Journal of Solid–State Circuits*, vol. 30, No. 4, Apr. 1995, pp. 443–452.

Kwak et al., "A 15–b, 5–Msample/s Low–Spurious CMOS ADC," *IEEE Journal of Solid–State Circuits*, vol. 32, No. 12, Dec. 1997, pp. 1866–1875.

Ingino, Jr. et al., "A Continuously–Calibrated 10Msample/s," *Digest of Technical Papers*, Feb. 6, 1998, pp. 145–146, 427.

Hester et al., "Fully Differential ADC with Rail–to–Rail Common–Mode Range and Nonlinear Capacitor Compensation," *IEEE Journal of Solid–State Circuits*, vol. 25, No. 1, Feb. 1990, pp. 173–183.

de Wit et al., "A Low–Power 12–b Analog–to–Digital Converter with On–Chip Precision Trimming," *IEEE Journal of Solid–State Circuits*, vol. 28, No. 4, Apr. 1993, pp. 455–461.

Tan et al., "Error Correction Techniques for High–Performance Differential A/D Converters," *IEEE Journal of Solid–State Circuits*, vol. 25, No. 6, Dec. 1990, pp. 1318–1327.

Tan et al., "A 5V, 16b 10μs Differential CMOS ADC," 1990 IEEE International Solid–State Circuits Conference, Feb. 15, 1990.

* cited by examiner

Primary Examiner—Michael Tokar
Assistant Examiner—Jean Bruner Jeanglaude
(74) Attorney, Agent, or Firm—Alan K. Stewart; Wade James Brady, III; Frederick J. Telecky, Jr.

(57) ABSTRACT

A user transparent self-calibration technique for an analog to digital converter is described. The technique can correct for capacitor mismatch error with minimal additional power consumption. This is done by generating a calibration signal, one for each capacitor whose calibration is desired. The signal is interleaved with the input signal, and digitized by alternating with the input signal digitization using capacitor arrays.

31 Claims, 11 Drawing Sheets

(Phase 2 (12))

(Phase 1 (11))

(Phase 1 (11))

Phase 3 (13))

Phase 3 (13))

(Phase 4)

(Phase 5)

(Phase 5)

(Phase 6)

(Phase 7)

(Phase 7)

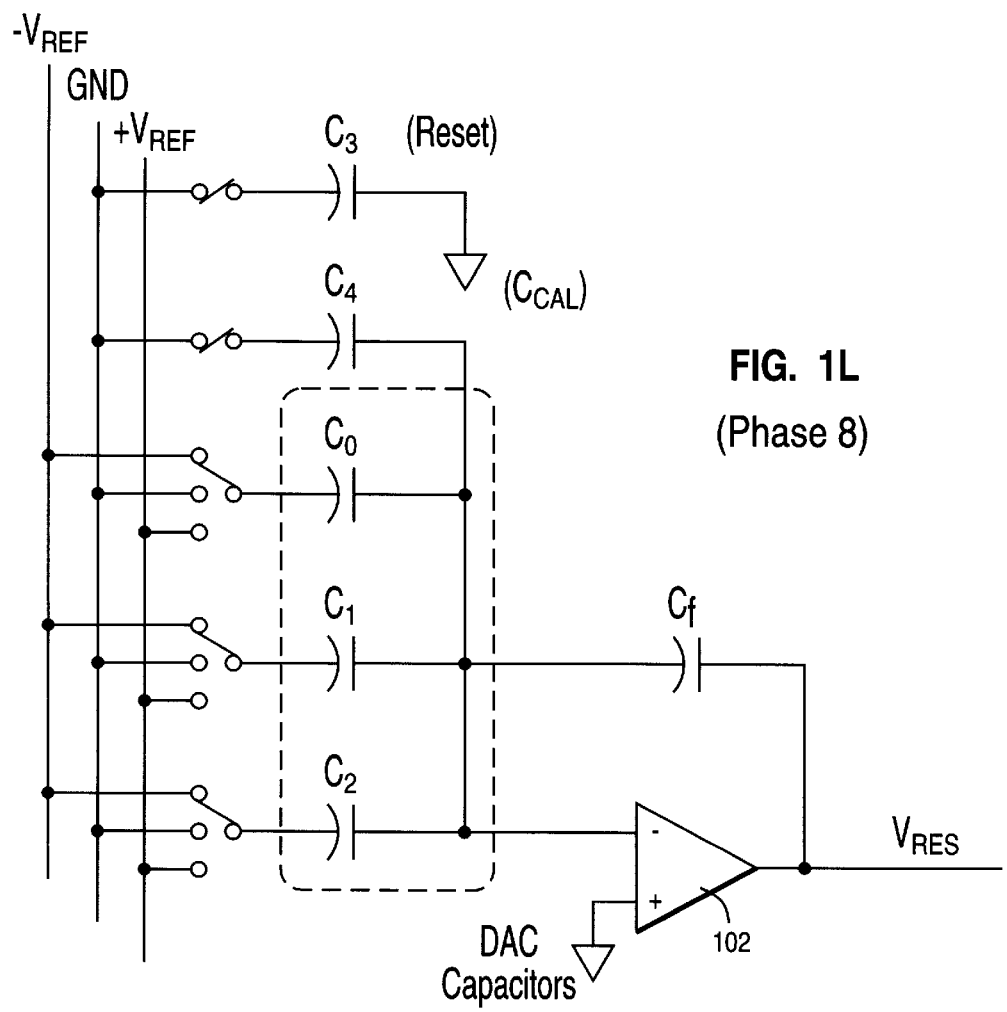
FIG. 1L (Phase 8)
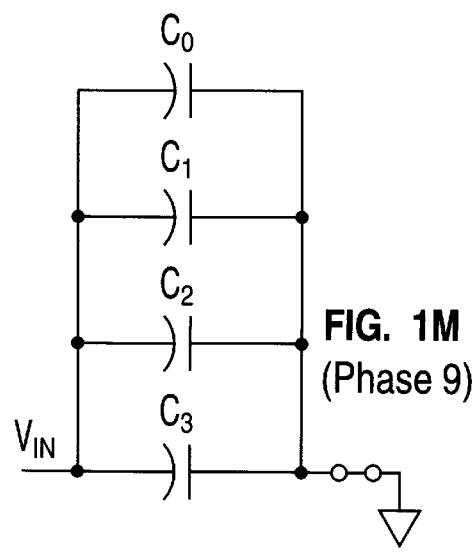
FIG. 1M (Phase 9)
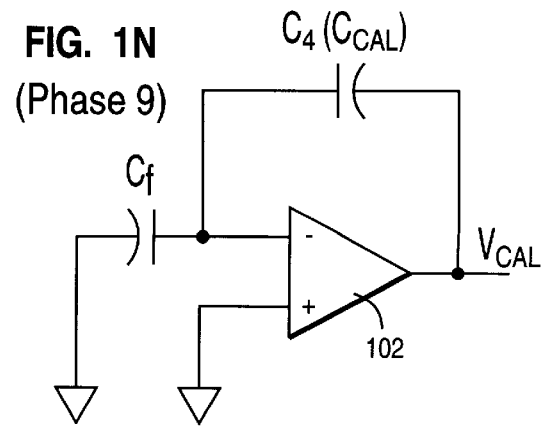
FIG. 1N (Phase 9)

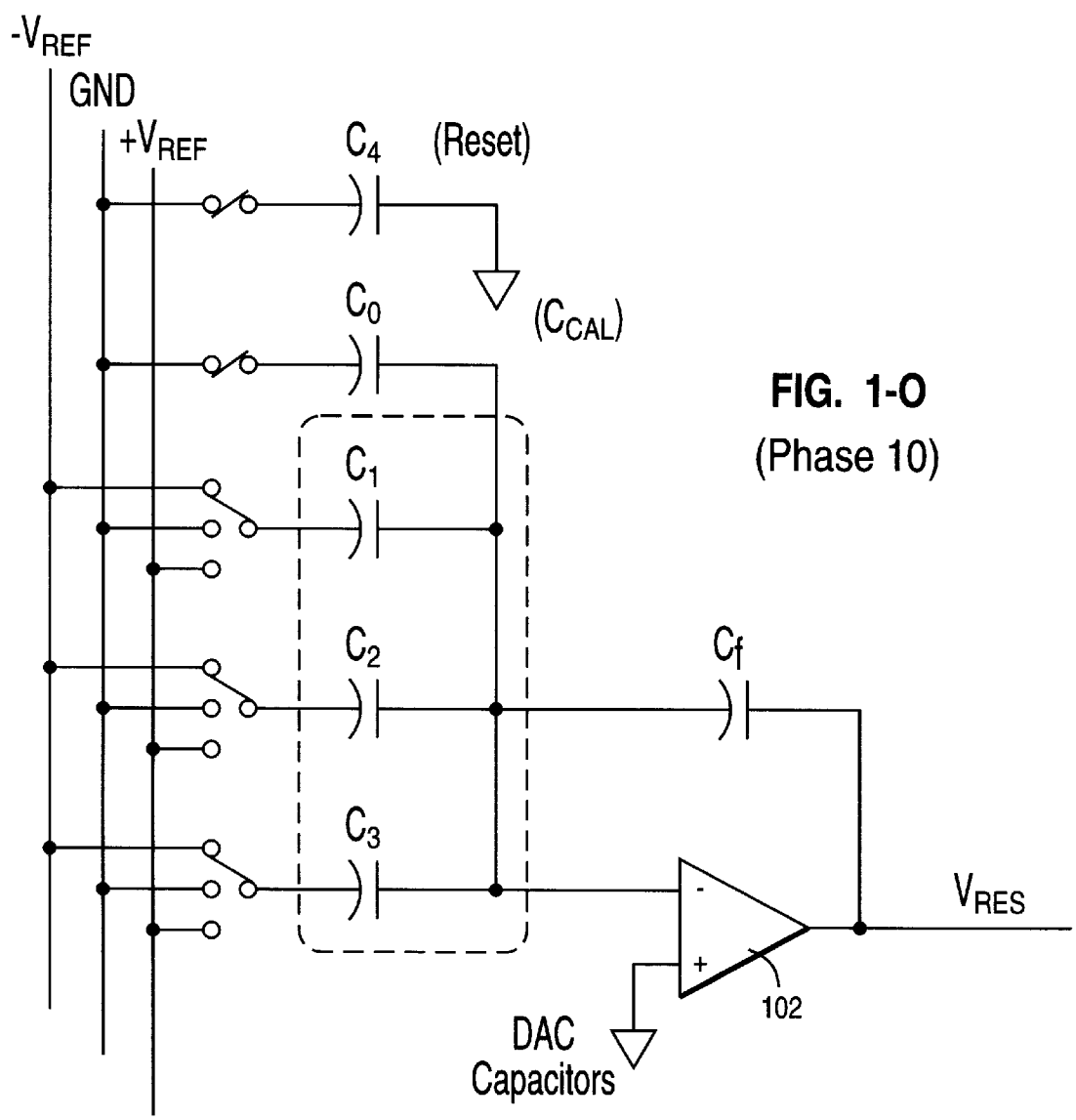
FIG. 1-O
(Phase 10)

| Phase | Φ 1 (and 11) | Φ 2 (and 12) | Φ 3 (and 13) | Φ 4 | Φ 5 |
|---|---|---|---|---|---|
| Related Figures | Figure 1B (and Figure 1C) | Figure 1A | Figure 1D and Figure 1E | Figure 1F | Figure 1G and Figure 1H |
| MSB Stage | Sample Vin on C1,C2,C3,C4 (Output $Vcal_0$) | Output Vres | Sample Vin on C0,C2,C3,C4 Output $Vcal_1$ | Output Vres | Sample Vin on C0,C1,C3,C4 Output $Vcal_2$ |
| Stage 2 | (Sample $Vcal_0$) (Output Vres) | Sample Vres (Output $Vcal_0$) | Sample $Vcal_1$ Output Vres | Sample Vres Output $Vcal_1$ | Sample $Vcal_2$ Output Vres |
| Stage 3 | (Sample Vres) | (Sample $Vcal_0$) (Output Vres) | Sample Vres (Output $Vcal_0$) | Sample $Vcal_1$ Output Vres | Sample Vres Output $Vcal_1$ |

| Phase | Φ 6 | Φ 7 | Φ 8 | Φ 9 | Φ 10 |
|---|---|---|---|---|---|
| Related Figures | Figure 1I | Figure 1J and Figure 1K | Figure 1L | Figure 1M and Figure 1N | Figure 1O |
| MSB Stage | Output Vres | Sample Vin on C0,C1,C2,C4 Output $Vcal_3$ | Output Vres | Sample Vin on C0,C1,C2,C3 Output $Vcal_4$ | Output Vres |
| Stage 2 | Sample Vres Output $Vcal_2$ | Sample $Vcal_3$ Output Vres | Sample Vres Output $Vcal_3$ | Sample $Vcal_4$ Output Vres | Sample $Vcal_4$ Output $Vcal_4$ |
| Stage 3 | Sample $Vcal_2$ Output Vres | Sample Vres Output $Vcal_2$ | Sample $Vcal_3$ Output Vres | Sample Vres Output $Vcal_3$ | Sample $Vcal_4$ Output Vres |

FIG. 4

(odd phase)

(odd phase)

(even phase)

(even phase)

USER TRANSPARENT SELF-CALIBRATION TECHNIQUE FOR PIPELINED ADC ARCHITECTURE

This application claims priority under 35 USC § 119(e)(1) of provisional U.S. application number 60/097,278 filed Aug. 19, 1998.

BACKGROUND AND SUMMARY OF THE INVENTION

The present invention relates to self-calibration of pipelined analog-to-digital converters.

Analog to Digital Conversion

Analog to digital conversion is the process of converting an analog data signal, which is most commonly represented as voltage, into a digital format. Determining a digital value which represents a particular analog input is known as "quantization". Serial, delta-sigma or oversampling, parallel, and pipelined are some of the many different analog to digital conversion architectures which exist. Different architectures are suited to different needs.

Serial analog to digital architecture offers the widest range of performance in analog to digital conversion, from low power and low resolution to quantizations with very high resolutions. Basic serial architecture quantizes analog data at the rate of one bit per cycle. Therefore, a digital sample having N bits of resolution will take N cycles to fully quantize. Delta-sigma analog to digital architecture is used in audio signal processing. The architecture is designed to translate high-speed, low-resolution samples into higher-resolution, lower-speed output. This process is also referred to as oversampling because more samples of the analog data are quantized than actually become output. Parallel analog to digital architecture provides the fastest quantization rate per analog signal. In the parallel architecture, a digital value per cycle is produced for each analog data sample, without regard to N, the number of bits of resolution. Parallel architecture requires that all quantization levels be simultaneously compared to the analog signal. This results in the use of $2^{N-1}$ comparators and $2^{N-1}$ resistors to achieve a digital value, with N bits of resolution, per cycle.

Pipelined Analog-to Digital Architecture

Pipelined analog to digital architecture is a method of quantizing an analog signal in stages. Algorithms exist for obtaining one or more bits of resolution per stage. For example, in a 1.5-bit per stage converter, the digital output of each stage is either 1, 0, or −1. One bit is resolved at each stage with the resulting analog residue passed along to the next stage for resolution of another bit. After a latency of N cycles, a single digital value for a single analog input is produced. Other methods are able to output more than 1 bit per stage, needing fewer latency cycles to produce a digital value with the same resolution. The use of pipelining permits a high degree of parallelism, so that one complete output per cycle can be produced after the pipeline fills up.

Pipelined analog to digital converters have many applications. They are particularly useful when low voltage, high speed, high resolution quantization is required. The pipelined analog to digital conversion architecture's ability to meet these demands makes it ideal for high volume telecommunications application such as various digital subscriber lines, digital signal processing at video rates, and for stand alone high speed analog to digital converters.

The advantage of pipelined analog to digital conversion is that each stage of resolution is separated. Once the analog signal is resolved at the first stage and the result passed to the second stage, a new signal can be processed by the first stage. The passing of result and signal from stage to stage continues to stage N at which point a digital value of N bits of resolution can be produced. Quantization of the first signal to N bits of resolution is achieved in N cycles of latency. However, because each stage resolves one bit and passes the result to the next stage, the former stage is free to resolve a bit of the next analog sample.

This pipeline design allows N analog samples to be in the process of quantization simultaneously. Once the first analog sample is quantized, after N cycles, each successive analog sample is quantized one cycle later. Thus, a high throughput of one sample per cycle is achieved.

Analog to Digital Conversion Error

Errors can be introduced into the conversion process at different stages by different components. The most common components in analog to digital conversion which can cause error are capacitors. Capacitors can introduce error because of a mismatch concerning the capacitance ratio of two or more capacitors used in sampling and amplifying an analog signal.

Capacitor Mismatch and Non-Linearity

A digital self-calibration technique for pipelined analog to digital converters which corrects for capacitor mismatch has been disclosed in Hae-Seung Lee, A 12-B 600 KS/S DIGITALLY SELF-CALIBRATED PIPELINED ALGORITHMIC ADC, IEEE Journal of Solid State Circuits, Vol 29, No. 4, Apr. 1994, at 509, which is incorporated herein by reference. This article demonstrates the necessary steps for determining the mismatch ratio of two nominally equal capacitors. The difference of the capacitance between two nominally equal capacitors, $C_1$ and $C_2$, can be represented as $C_1=(1+\alpha_i)C_2$ where $\alpha_i$ represents the mismatch ratio in capacitance between capacitors $C_1$ and $C_2$. Once $\alpha_i$ is known, the error due to capacitance mismatch can be canceled by adding a digital correction quantity:

$$\frac{\alpha_i}{2^i}[(D(i)/2^i - D(i+1)/2^{i+1} - D(i+2)/2^{i+2} - \ldots]$$

to the digital output, where D(i) represents the digital output of the ith stage of a pipelined analog to digital converter.

In the Lee article, several assumptions are made concerning the need for digital self-calibration and the extent to which error should be corrected. The article assumed that the only linearity error present in a 1.5 bits per stage converter is caused by capacitor mismatch. This assumption was based on the presence of an operational amplifier at each stage of the pipeline with "high enough" gain to effectively eliminate the amplifier gain and non-linearity. In other words, the article assumes an amplifier with infinite gain.

Analog ti Digital Background Calibration Techniques

Various self-calibration techniques have been proposed to address the capacitor mismatch induced by the digital to analog subconverter (DASC) and interstage gain error. Most of these techniques require the normal operation of the converters to be interrupted in order to perform the calibration. This can impose a burden on the user who must decide when the converter can be interrupted and when the converter needs be re-calibrated due to temperature or other environmental changes. A superior method is to use a background calibration technique whose operation is transparent to the user. Three different background calibration techniques have recently been proposed.

Measuring Error with a $\Sigma\text{-}\Delta$ Analog to Digital Converter (ADC)

An approach using a $\Sigma\text{-}\Delta$ analog-to-digital converter (or "ADC") to measure the DASC error is given by Tzi-Hsiung Shu, A 13-B 10-MSAMPLE/S ADC DIGITALLY CALIBRATED WITH OVERSAMPLING DELTA-SIGMA CONVERTER, IEEE Journal of Solid State Circuits, Vol 30, No. 4, April 1995, at 443, which is incorporated herein by reference. In this approach, once the error is measured, it is subtracted out in the digital domain. The drawback of this technique is that it requires the DASC to be implemented as a resistor string which dissipates DC current. The reason for using a resistor string is that the DASC analog output levels are continuously available. This availability makes continuous calibration simple to implement at the expense of power consumption. Another drawback of this technique is that the added $\Sigma\text{-}\Delta$ ADC consumes power and area. Furthermore, any interstage gain error present in the ADC is not calibrated. The use of a resistor string digital to analog converter (DAC) highlights the difficulty of user-transparent calibration with a capacitor DAC.

Measuring Error Using an Extra Clock Cycle

Another background calibration technique which allows the ADC to occasionally skip one clock cycle to permit the calibration to be performed is given by Sung-Ung Kwak, et al, A 15-B, 5-MSAMPLE/S LOW-SPURIOUS CMOS ADC, IEEE Journal of Solid State Circuits, Vol. 32, No. 12, Decmber 1997, at 1866, which is incorporated herein by reference. In this technique, digital interpolation circuitry is used to interpolate the missing sample. The drawback of this approach is that the added digital circuitry is complex and consumes significant amounts of power and area. A final problem with this method is that because samples are skipped, the ADC can no longer convert analog signals at a Nyquist rate (that is, a conversion rate of twice the highest frequency signal or noise component).

Measuring Error with an Extra Calibration Stage

A third technique, adding an extra stage to the pipeline, is given by J. Ingino and B. Wooley, A CONTINUOUSLY-CALIBRATED 10 MSAMPLE/S 12B 3.3V ADC, Digest Int'l Solid State Circuit Conference, February 1998, at 144, which is incorporated herein by reference. While the ADC is in normal operation, this extra stage is calibrated. One stage of the pipeline is then switched out for calibration while the extra calibrated stage is switched into the pipeline. The drawback with this approach is that in a well designed pipeline, the first few stages, which are the most critical, usually consume more power than later stages. Since the accuracy of the pipeline is determined by the accuracy of the first few stages, the extra stages added for calibration will consume significant amounts of power. In addition, this technique requires an additional successive approximation ADC to measure the error. Although the successive approximation ADC can be low power, it has to consume enough power to be fast enough to track temperature and other environmental changes.

Standard, Uncalibrated Pipeline Stage

In order to understand the proposed calibration technique, it is useful to examine the circuit implementation of a standard uncalibrated pipeline stage as shown in FIGS. 3A and 3B. In this example, four capacitors, $C_1\text{-}C_4$ are used in an (approximately) 2.8-bits per stage implementation. The precise number of bits depends on the precise analog to digital sub-converter arrangement, as is commonly known in the art. The ADC uses a two phase non-overlapping clock to drive the process. The first phase is the sampling phase, the second is the D/A conversion, subtraction and amplification phase (hereafter referred to as the amplification phase).

During the sampling phase, depicted in FIG. 3A, the op-amp 302 is in a unity gain inverting configuration that drives the negative input node of the op-amp to a virtual ground. At the same time, the analog input to be converted is applied to the bottom plates of the four sampling capacitors, $C_1\text{-}C_4$. After sampling, the input is stored on the four capacitors as charge. An analog to digital sub-converter (ADSC), is used, as is common in the art, for obtaining the coarse value.

During the amplification phase, depicted in FIG. 3B, $C_1$ is selected as the feedback capacitor with its bottom plate connected to the output of the op-amp. At the same time, depending on the coarse decision from the ADSC, the bottom plates of $C_2\text{-}C_4$ are connected to $V_{REF}$, $-V_{REF}$ or GND. The resulting output, $V_{RES}$, is the difference between the analog input and an analog representation of the coarse digital conversion of the input. $V_{RES}$ is passed on to the next stage.

One problem with using the above circuit implementation for user-transparent calibration is that it lacks a method by which a known signal can be injected into the circuit to produce a signal that is a function of the capacitor mismatch. Such a signal can be used to calibrate the ADC.

Self-calibration Technique for an ADC Architecture that is User Transparent

The present application discloses a self-calibration method for an analog to digital converter that is transparent to the user and corrects for capacitor mismatch errors. In the preferred embodiment the use of dedicated capacitors for calibration permits digitization of the input signal and a calibration signal to be carried out in an interleaved manner in a serial ADC. A calibration capacitor replaces each sampling capacitor one at a time during the sampling phase, while that sampling capacitor is being used to generate a calibration signal. This ensures that there is no significant loss of efficiency and no need to add any power hungry op-amps.

An advantage of the present disclosure is that the approach is a very simple architectural structure, which is less costly in terms of both power consumption and area, as compared with other methods.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 4 illustrates how information is processed by the circuits of FIGS. 1A–1O.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

A User Transparent Self-Calibration Technique

One way to make a self-calibration technique transparent to the user is to interleave the calibration with the sampling and digitization of the input signal. Interleaving these functions enables the ADC to generate calibration information without affecting throughput. That is, a pipelined ADC with a 20 kHz sample rate, for example, can take advantage of this technique, generating calibration information while maintaining a 20 kHz sample rate. In the preferred embodiment, user-transparent self-calibration is implemented by the addition of two capacitors to the most significant bit (MSB) stage of a serial ADC, and an extra array of capacitors to succeeding least significant bit (LSB) stages as desired. With this architecture, interleaving of analog sampling and calibration in the MSB stage occurs in the amplifying and the combined sampling and calibrating phases. In the LSB stage, the interleaving takes place between the digitization of the input signal, and the digitization of the calibration signal.

This interleaving technique may be used with a variety of AD converter architectures, including hybrid and recycling ADCs. This approach permits the calibration to take place while the input signal is being sampled without any loss of throughput.

Figure 1A:
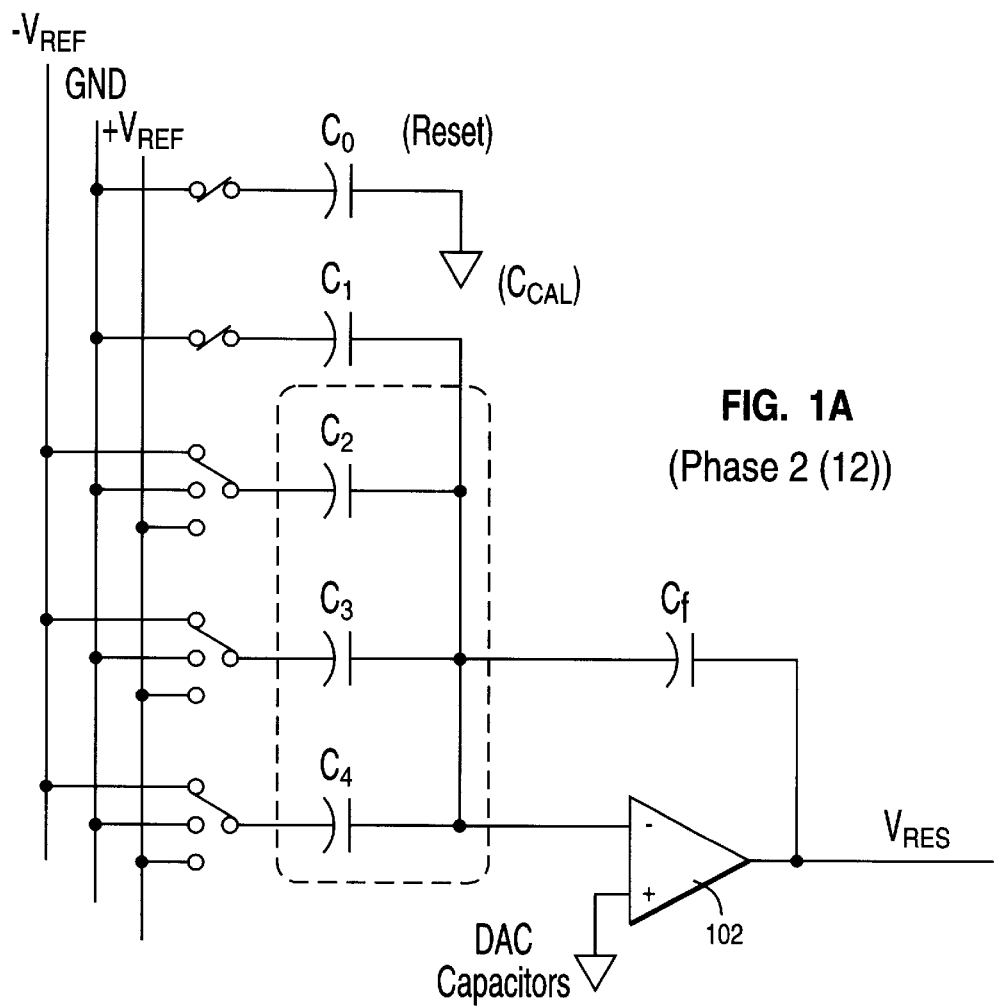
FIGS. 1A–1O show one possible self-calibrating pipelined analog to digital converter circuit in various phases.

FIGS. 1A–1O depict a sample embodiment of a user transparent self-calibration technique. An aid for following this explanation is given by FIG. 4, which outlines the sequence of steps for the phases of the method's operation in accordance with FIGS. 1A–1O. Although for convenience, a sequence of ten "phases" are shown in FIGS. 1 and 4, it is to be understood that only two phases per clock cycle are used in the presently preferred embodiment. Hence, phase 3, for example, refers to the first phase of the second clock cycle, phase 4 refers to the second phase of the second clock cycle, and so on. For the purpose of clarity, this disclosure uses a simple 2.8-bit (approximately) converter to illustrate the method. Ten phases of the MSB are used for all capacitors in the sample embodiment of FIG. 1A–1O to be used in calibration signal generation. FIG. 4 illustrates the propagation of the analog signal and the calibration signal through the MSB and two of the N-1 LSB stages of the ADC. Although ten phases are depicted, phase 11 is the same as phase 1 with respect to the capacitors which are used for sampling, phase 12 the same as phase 2, etc., as the ADC continues to digitize samples. For clarity, phases 1, 2, and 3 are also shown as phases (11), (12), and (13). For ease of understanding, FIGS. 1 and 4 show the sequence of clock phases the ADC goes through immediately after a power up, starting with phase 1. It is understood that during the initial power up during phase 1, the calibration signal, $V_{cal0}$, for capacitor $C_0$ shown in FIG. 1C, is not valid yet as it has not the chance to perform the required operation shown in FIG. 1O in the previous phase.

In this embodiment, 5 main capacitors, labeled $C_0$ to $C_4$, are used, along with a dedicated feedback capacitor, $C_f$. Because the method, as illustrated here, is being used in a pipelined converter, there is a "startup" period. After the startup, a cyclical series of steps repeats itself continuously. Thus, Phase 1 and Phase 11 are essentially similar once the pipe is full, and so are Phase 2 and Phase 12, etc. In this embodiment there are 2 phases per clock cycle, as is well known in the art, an odd phase and an even one. Sampling and calibration signal generation takes place during the odd phases and generating the residual signal, represented as voltage, occurs during the even phases.

Figure 1B:
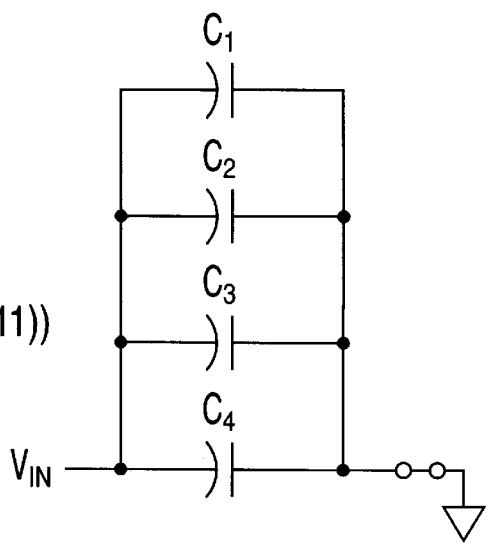
Figure 1C:
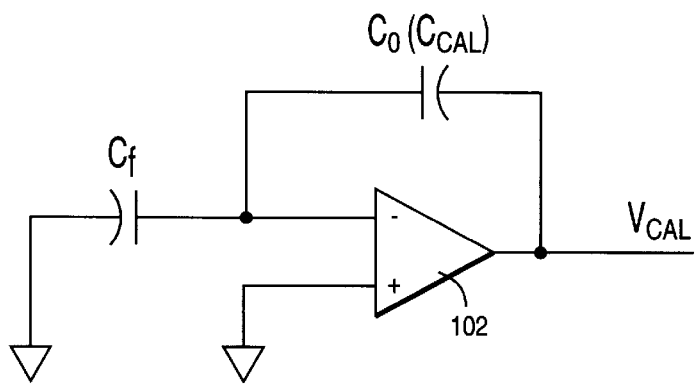

FIG. 1B depicts a sampling phase, which is taken to be the one starting phase of the pipeline (or phase 1 of FIG. 4). Here the four capacitors $C_1$–$C_4$ are used to sample the input signal, $V_{IN}$. Since the offset of the op-amp 102, depicted in FIG. 1A, results in an overall offset of the ADC when digital error correction is used, the op-amp 102 is not used in the sampling phase. As mentioned, the 5th capacitor, $C_0$, is not used in this phase.

In the next phase, amplification, (phase 2 of FIG. 4) the extra capacitor, $C_0$, in the location labeled reset, is connected to GND as depicted in FIG. 1A. Three of the sampling capacitors $C_2$–$C_4$ are connected with the dedicated feedback capacitor $C_f$ and $C_1$ to produce $V_{RES}$. Since, during phase 2, the bottom plate of $C_1$, is connected to GND, the charge proportional to $V_{IN}$ sampled on $C_1$, during the previous phase is transferred to $C_f$, setting $C_1$ up for calibration in phase 3.

Figure 1D:
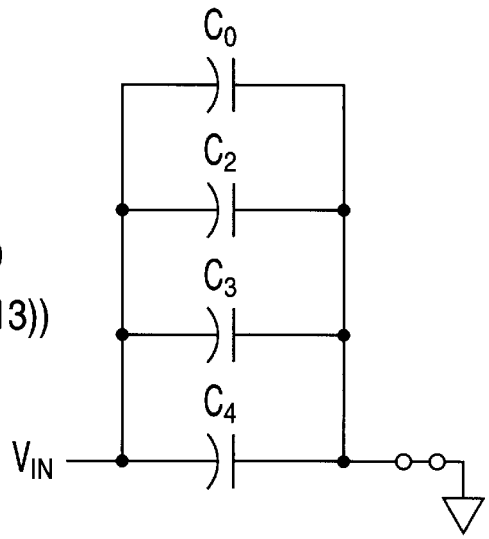
Figure 1E:
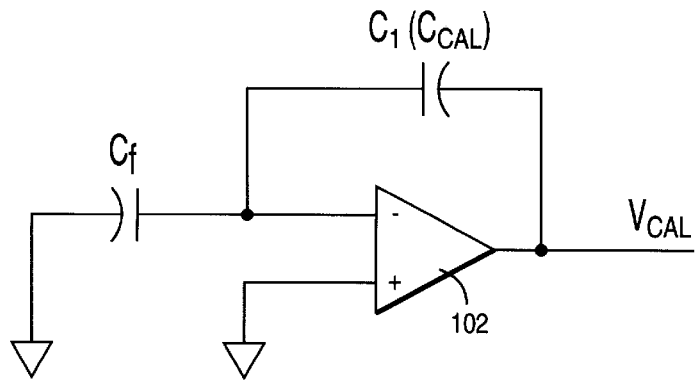

During the next phase, phase 3 of FIG. 4, also shown by FIGS. 1D and 1E, sampling is done on capacitors $C_0, C_2, C_3, C_4$, while $C_1$, is used in conjunction with the op-amp 102 to generate its own calibration information, $Vcal_1$, which in turn is passed on to the next stage for digitization, described later.

Figure 1F:
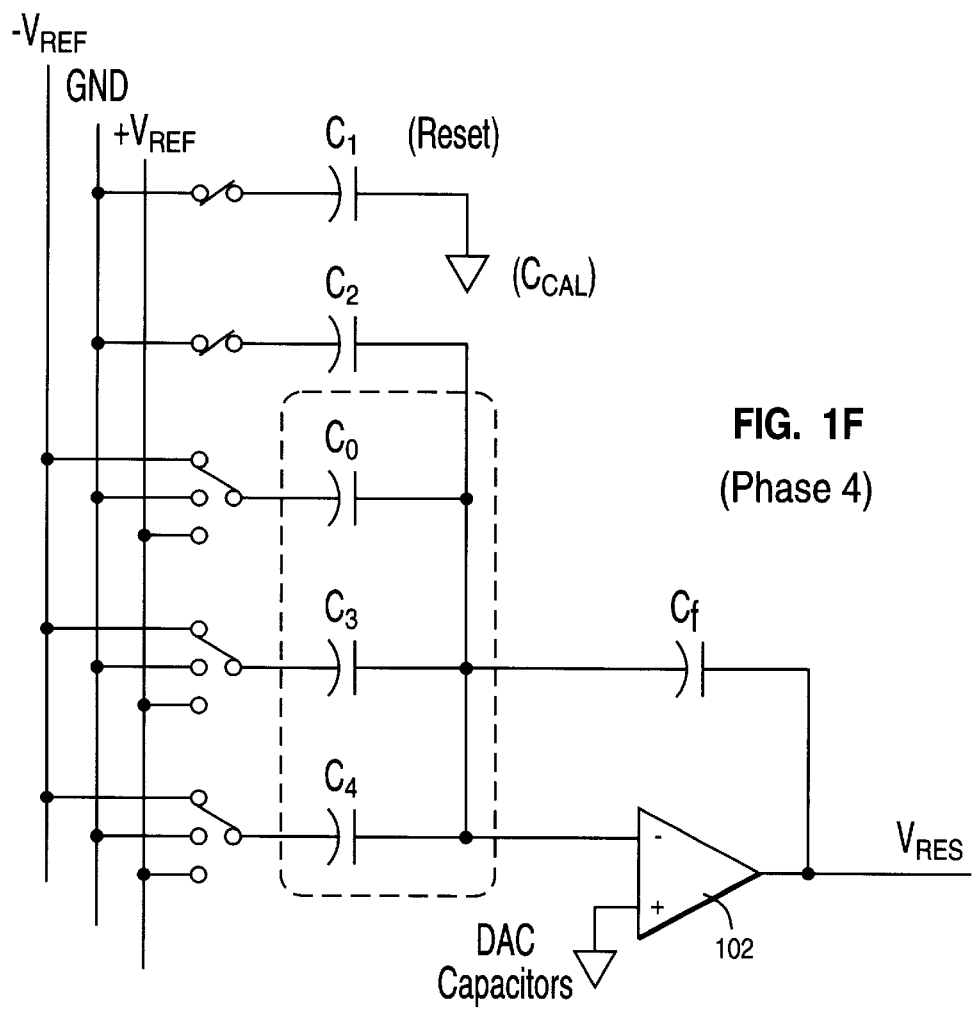
Figure 1G:
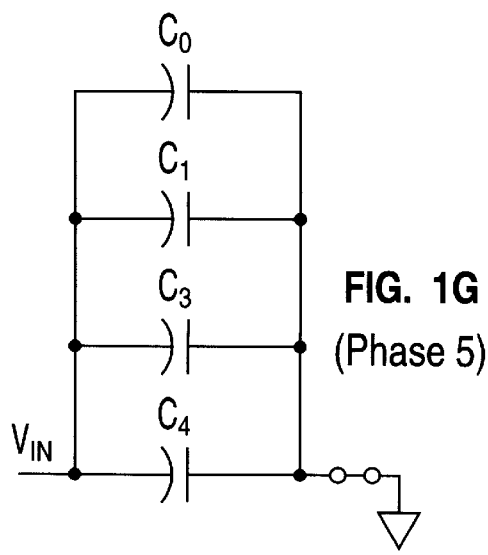
Figure 1H:
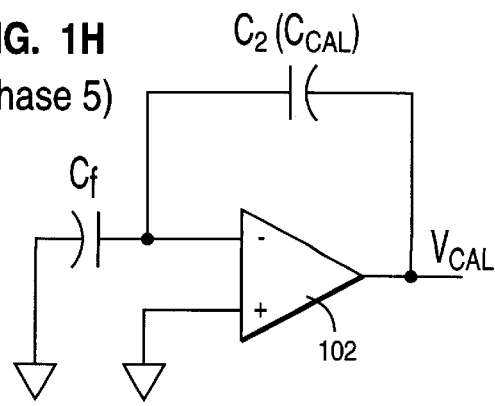
Figure 1I:
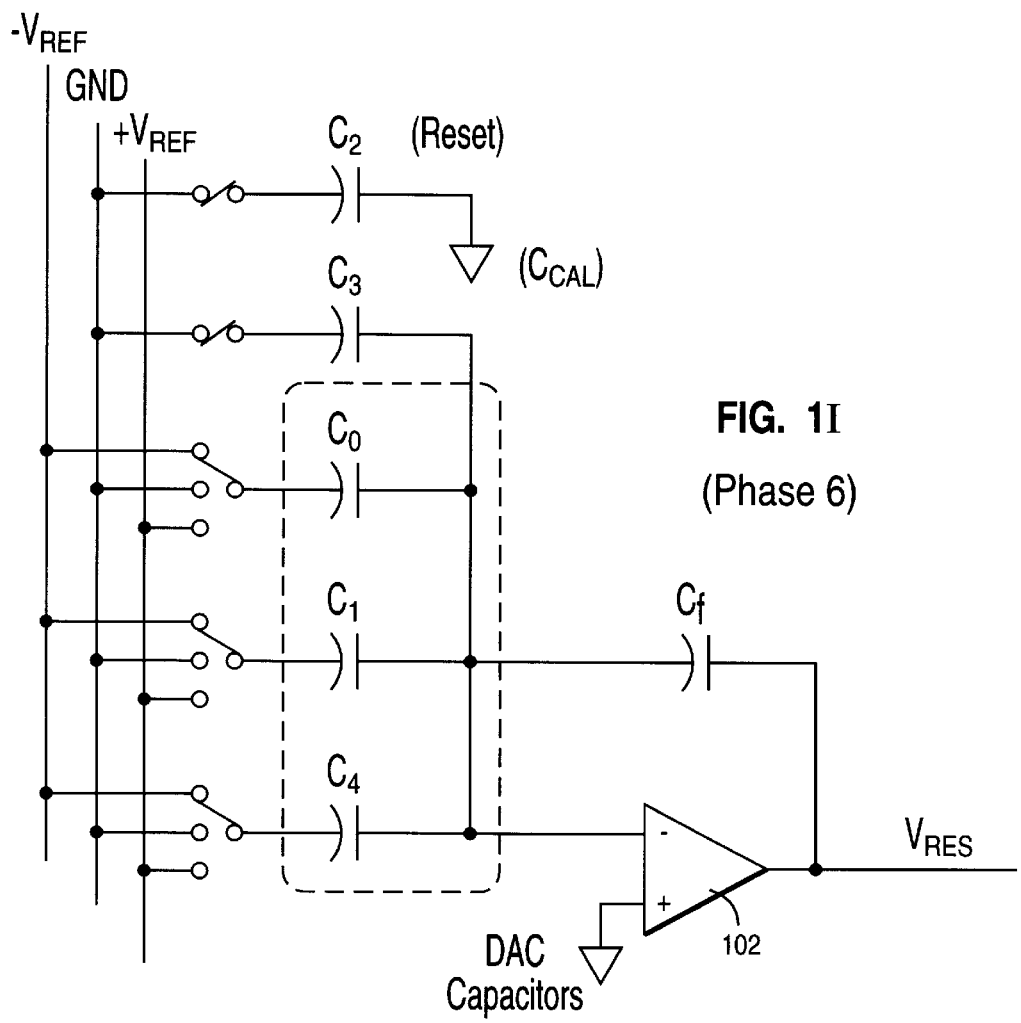
Figure 1J:
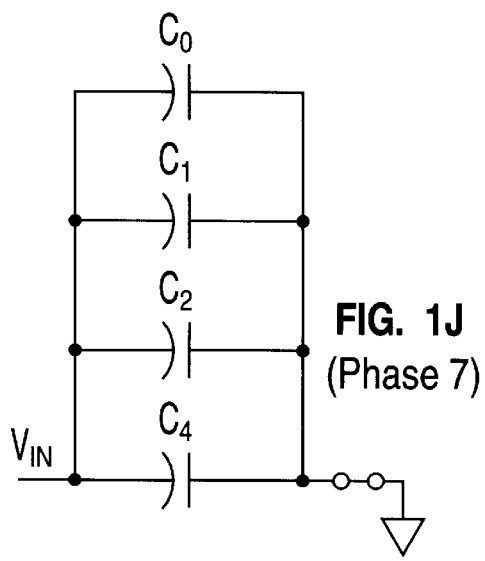
Figure 1K:
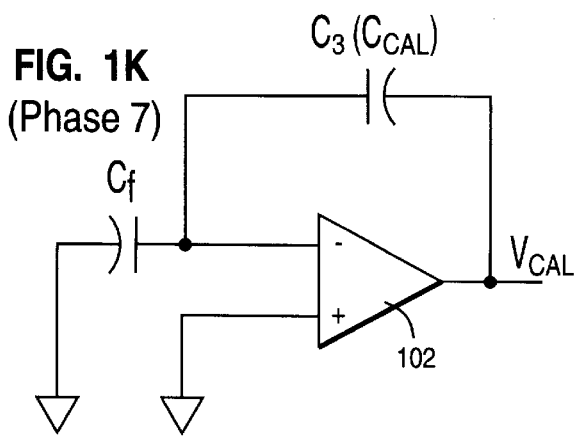
Figure 2:
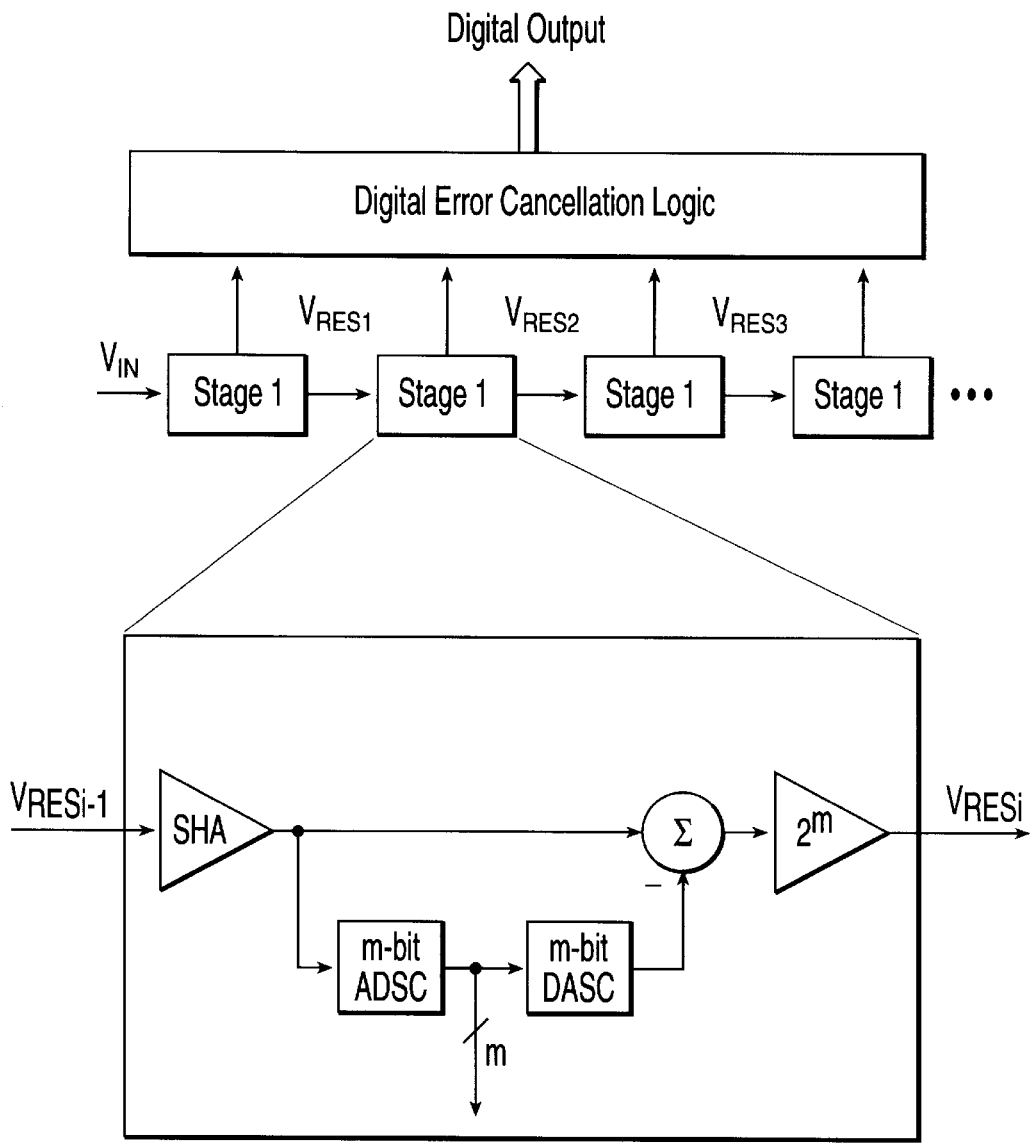
FIG. 2 illustrates a conventional pipelined architecture.
Figure 3A:
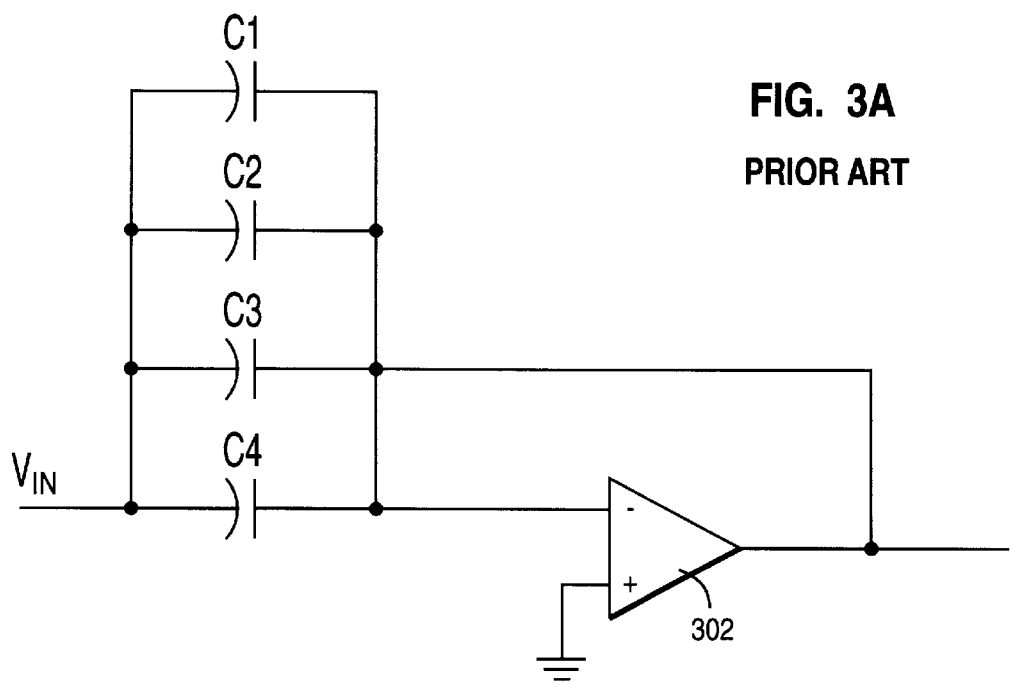
FIGS. 3A and 3B schematically depict a conventional circuit implementation of a pipelined stage for a 2.8 bit/stage converter.
Figure 3B:
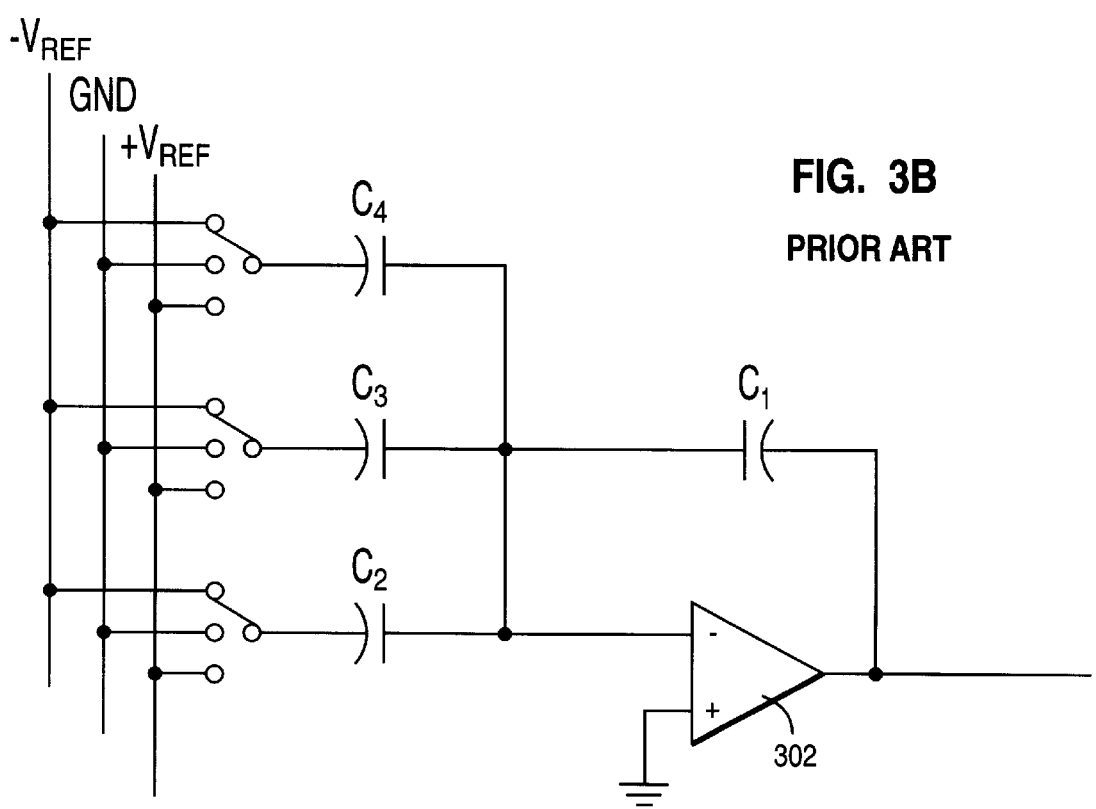
Figure 5A:
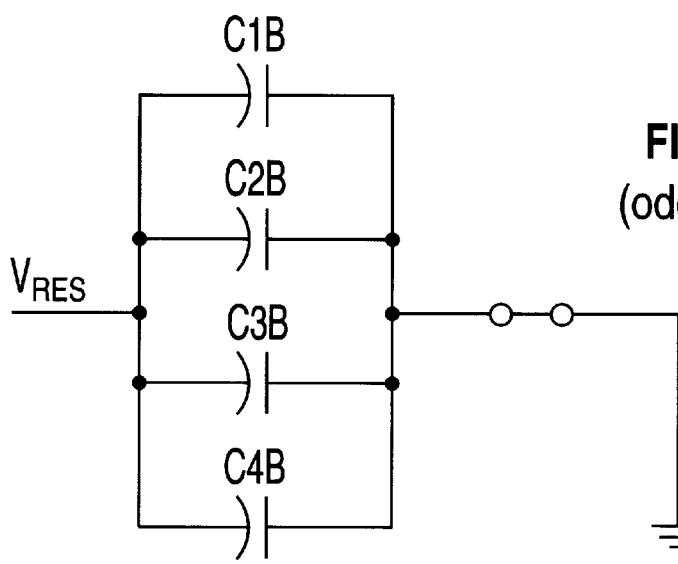
FIGS. 5A, 5B, 5C, and 5D depict one possible circuit implementation for processing the least significant bit stages used for digitizing $V_{RES}$ and $V_{CAL}$.
Figure 5B:
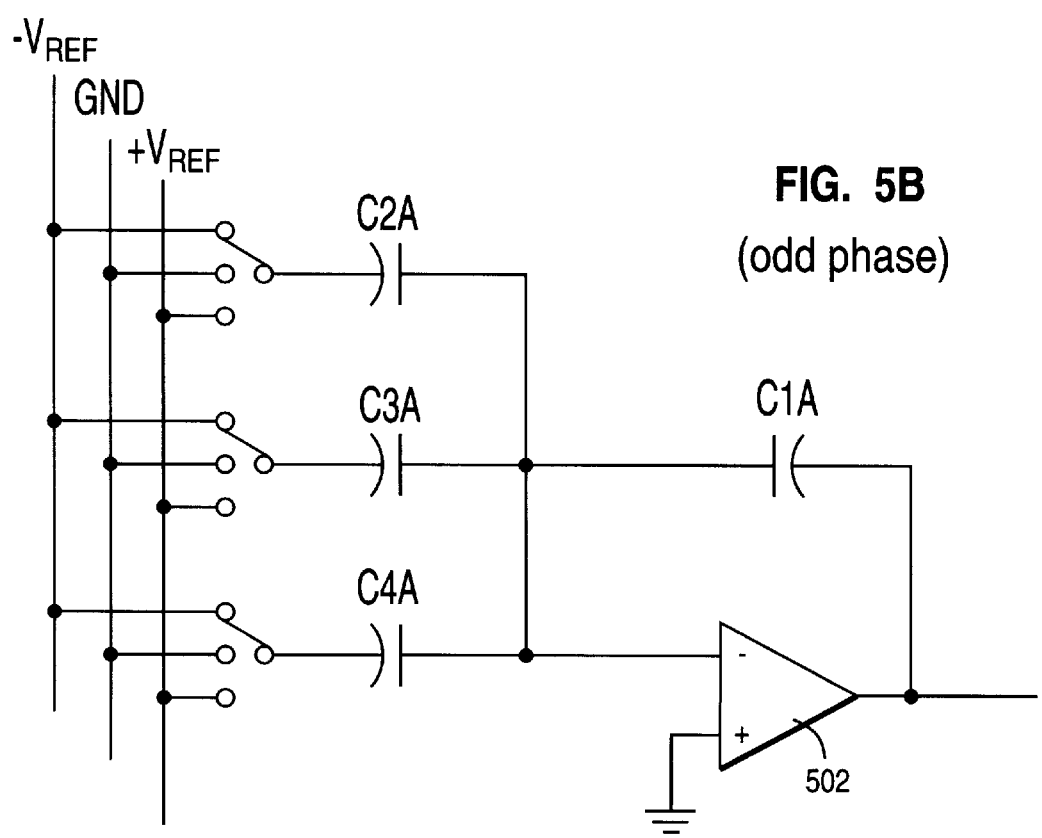
Figure 5C:
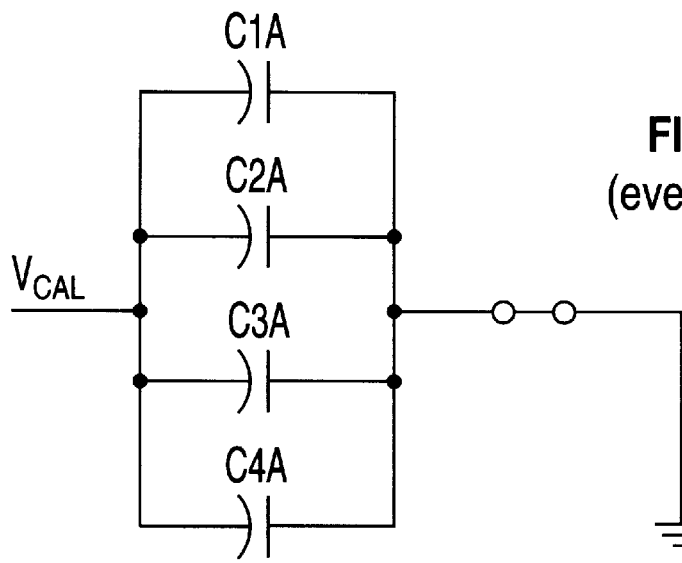
Figure 5D:
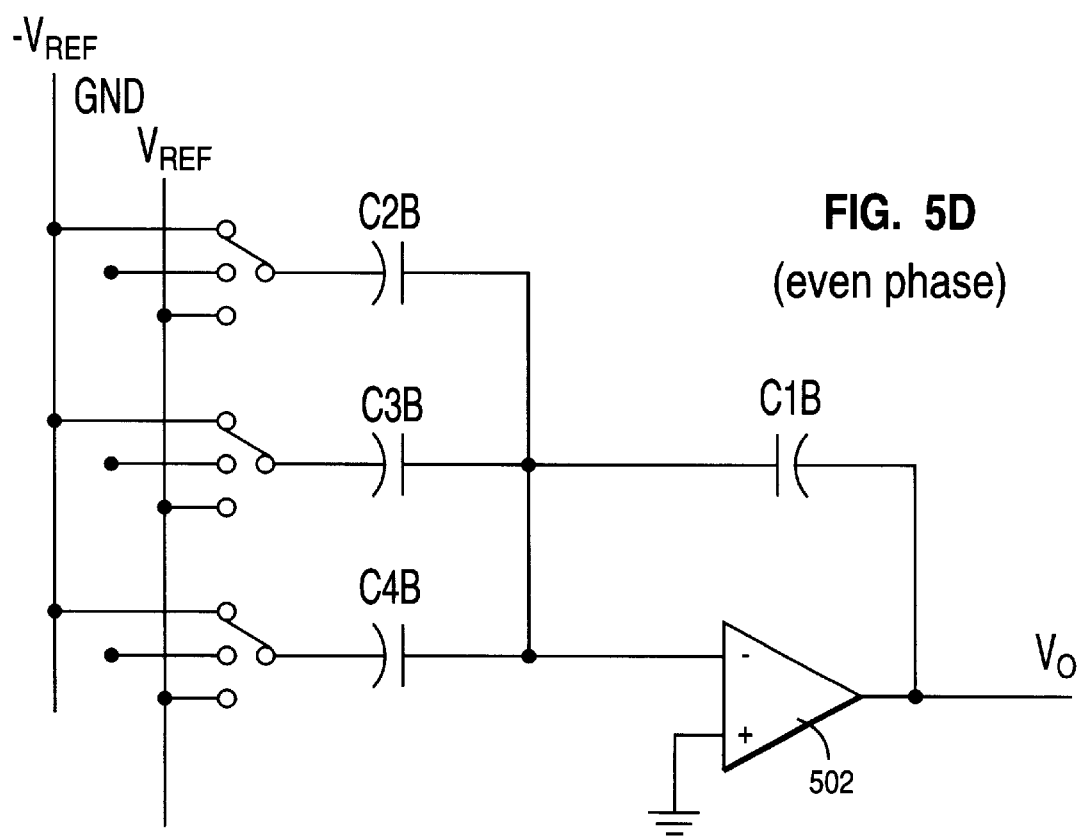

In phase 4 in FIG. 1F, while $C_0$, $C_3$, and $C_4$ serve as the DASC capacitor, the top plate of $C_1$, is reset to GND so as not to corrupt the residue voltage by the charge proportional to $V_{CAL}$ stored during the previous phase. At the same time, the bottom plate of $C_2$ is connected to GND. This allows charge proportional to $V_{IN}$ sampled on $C_2$ during the previous phase to transfer to $C_f$ setting $C_2$ up for calibration in phase 5.

During successive conversions, illustrated by FIGS. 1G–1O, in the sampling phase, the input signal $V_{IN}$ is again sampled on four sampling capacitors, selected from $C_0$–$C_4$, excepting the one currently being calibrated, which is in location $C_{CAL}$. The group of sampling capacitors includes the previously calibrated $C_{CAL}$. Simultaneously with the new sampling, a calibration signal for the capacitor currently being calibrated, $C_{CAL}$, is generated. Once each capacitor, $C_0$–$C_4$ has been calibrated, the process then repeats itself while analog input is to be digitized. Once the process repeats (phases 11 and following of FIG. 4), sampling is performed as described in FIG. 1B.

After each sampling phase, in the amplifying phase, three of the four sampling capacitors are used as DASC capacitors, based on the coarse decision of the A/D converter. The capacitor that was just calibrated previously is "reset" by grounding its top plate. This prevents calibration information from corrupting the residue voltage. The capacitor about to be calibrated is also part of the op-amp feedback loop, but with its bottom plate connected to ground.

It can be shown that the output voltage of the op-amp 102 in FIG. 1C is given by:

$$V_{CAL} = V_{RES}\left(\frac{C_f}{C_{CAL}}\right)\left(\frac{1 + \frac{C_f + C_{CAL} + C_p}{C_f}\frac{1}{a}}{1 + \frac{C_f + C_{CAL} + C_p}{C_{CAL}}\frac{1}{a}}\right) \cong V_{RES}\left(\frac{C_f}{C_{CAL}}\right)2$$

In this equation, a is the gain value of the op-amp 102, which would be infinity for an ideal op-amp. $C_p$ represents the parasitic capacitance of the circuit, at the inverting input of the op-amp 102, normally a very small value, and ideally zero.

This equation shows that the op-amp 102 produces a voltage that is directly proportional to the ratio of $C_f$ and $C_{CAL}$. Since the voltage $V_{RES}$ is known from the ADC conversion in the previous clock phase, the mismatch between $C_f$ and $C_{CAL}$ is the difference between the digital output of the following stages when the input changes from $V_{RES}$ to $V_{CAL}$.

FIGS. 5A–5D depict the presently preferred architecture for the least significant bit (or LSB) pipeline stages. Since the LSB stages of the pipeline need to be able to digitize $V_{RES}$ and $V_{CAL}$. during consecutive phases of ADC operation, an additional array of capacitors is added in these stages in a manner similar to a double-sampled pipeline. The four sampling capacitors $C_{1B}$–$C_{4B}$ are used to sample $V_{RES}$ (on even phases), while the op-amp 502 and capacitors $C_{1A}$–$C_{4A}$ are processing the previous $V_{CAL}$ for the remaining pipeline to digitize. During the next phase when the MSB stage outputs $V_{CAL}$ (odd phases), the four sampling capacitors $C_{1A}$–$C_{4A}$ are used to sample $V_{CAL}$, while the op-amp 502 together with $C_{1B}$–$C_{4B}$ are processing $V_{RES}$ for the remaining pipeline to digitize. In this manner, the input signal and the calibration signal are altenatingly digitized by the pipeline without adding extra op-amps and increasing power dissipation. Thus, each of the capacitors from the MSB stage generates its own $V_{CAL}$ signal which is passed down the pipeline. Digitization of the residue signal, $V_{RES}$, and the calibration signal, $V_{CAL}$, is interleaved in the LSB stages.

The digitized capacitor mismatch signals may then be processed by a digital error cancellation logic unit (or digital correction logic). One simple approach to digital error cancellation would be to maintain a running average of total error or error for each capacitor, which could then be subtracted from the digitized signal value. In this embodiment other digital error correction technology, as is well known in the art, may also be used.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should also be noted that, over time, an increasing number of functions tend to be combined into a single chip. The disclosed inventions can still be advantageous even with different allocations of functions among chips, as long as the functional principles of operation described above are still observed.

For another example, mismatch between the two sets of capacitors in the LSB stages can limit the accuracy of digitizing the mismatch between $C_f$ and $C_{CAL}$. Therefore, the LSB stages can be calibrated in manner similar to FIGS. 1A–10. Since capacitor mismatch is measured with reference to $C_f$, the gain and offset errors can be calibrated out first before calibrating the MSB stages of the pipeline. Errors of any particular stage could be digitized and corrected for by following stages, which would cascade the error correction process.

For another example, error correction logic may require the inclusion of a memory unit and the necessary control structure to store, further process, and communicate the results of the calibration.

For another example, a 2.8 bit (approximately) MSB stage is illustrated. However, stages resolving a different number of bits, such as a 5-bit per stage converter can also make use of this self-calibration technique. For an m bit stage, $2^m$ capacitors are needed, plus the addition of capacitors $C_0$ and $C_f$. Again, the number of stages receiving extra capacitor arrays may be varied.

For another example, the number of LSB stages used for resolving $V_{CAL}$ may also vary, since the resolution required may not be as great for a reasonable calibration value as for resolving $V_{RES}$. Similarly, the digital self-calibration technique described here can be used in combination with other self-calibration techniques.

Further details of the system context and of options for implementation and modifications may be found in Michael J. Demler, HIGH-SPEED ANALOG-TO-DIGITAL CONVERSION (1991); Analog Devices, Inc., ANALOG-DIGITAL CONVERSION HANDBOOK (1986); and Behzad Razavi, PRINCIPLES OF DATA CONVERSION SYSTEM DESIGN (1995); IEEE Journal of Solid-State Circuits April 1994, A 12-B 600 KS/S DIGITALLY SELF-CALIBRATED PIPELINED ALGORITHMIC ADC 509; IEEE Journal of Solid-State Circuits February 1990 FULLY DIFFERENTIAL ADC WITH RAIL-TO-RAIL COMMON-MODE RANGE AND NONLINEAR CAPACITOR COMPENSATION 173; IEEE Journal of Solid-State Circuits April 1993 A LOW-POWER 12-B ANALOG-TO DIGITAL CONVERTER WITH ON-CHIP PRECISION TRIMMING 455; IEEE Journal of Solid-State Circuits December 1990 ERROR CORRECTION TECHNIQUES FOR HIGH-PERFORMANCE DIFFERENTIAL A/D CONVERTERS 1318; IEEE Journal of Solid-State Circuits April 1991 A 13B 2.5 MHz SELF-CALIBRATED PIPELINED A/D CONVERTER IN 3UM CMOS 628; and U.S. Pat. No. 5,510,789 ALGORITHMIC A/D CONVERTER WITH DIGITALLY CALIBRATED OUTPUT; all of which are hereby incorporated by reference.

What is claimed is:

1. A method for performing analog to digital conversion, comprising the steps of:
   in first stage of an analog-to-digital converter:
      sampling an analog signal;
      digitizing said analog signal to produce a digital output;
      generating a residue signal relative to said digital output; and
      generating a calibration signal relative to the capacitor mismatch of said first stage;
   wherein said generating steps are interleaved in a manner such that the throughput of said analog-to-digital converter is not decreased.

2. The method of claim 1, wherein said analog-to-digital converter is a pipelined analog-to-digital converter.

3. The method of claim 1, wherein said generating a calibration signal step and said sampling step are performed concurrently.

4. The method of claim 1, wherein said first stage utilizes an additional capacitor such that said sampling step and said generating a calibration signal step are performed concurrently.

5. The method of claim 1, wherein said generating a calibration signal step utilizes a capacitor which was utilized in an immediately preceding sampling step.

6. The method of claim 1, wherein said generating steps utilize an additional capacitor as a feedback capacitor.

7. The method of claim 1, further comprising the steps of:
in successive stages 6f said analog-to-digital converter
digitizing said residue signal; and
digitizing said calibration signal;
wherein said digitizing steps are interleaved in a manner such that throughput of said analog-to-digital converter is not decreased.

8. The method of claim 1, further comprising the steps of:
in successive stages of said analog-to-digital converter
digitizing said residue signal; and
digitizing said calibration signal;
wherein said successive stages utilizes two capacitor arrays such that said digitizing steps are interleaved in a manner such that throughput of said analog-to-digital converter is not decreased.

9. The method of claim 1, further comprising the step of calibrating the digital output of said analog-to-digital converter with digital correction logic.

10. The method of claim 1, in which the capacitor mismatch of more than one stage is calibrated.

11. The method of claim 1, wherein said capacitor mismatch is corrected only for said first stage.

12. A method for performing analog-to-digital conversion, comprising the steps of:
performing a first stage of analog-to-digital conversion on an analog input signal in an analog-to-digital converter;
producing a residue signal;
generating a calibration signal;
in successive stages of said analog-to-digital converter:
digitizing said residue signal to obtain a coarse digital value; and
digitizing said calibration signal to obtain a coarse digital calibration value;
using said coarse digital calibration values to correct said coarse digital values; and
producing a calibrated digital output from said analog-to-digital converter;
wherein said calibration signal represents the capacitor mismatch of a capacitor used to generate said residue signal and said residue producing step and said generating step are interleaved in a manner such that the throughput of said analog-to-digital converter is unchanged.

13. The method of claim 12, wherein said generating step is performed while said analog input signal is sampled.

14. The method of claim 12, wherein said first stage utilizes an additional capacitor such that said performing step and generating step are performed concurrently.

15. The method of claim 12, wherein said generating step utilizes a capacitor utilized in an immediately preceding performing step.

16. The method of claim 12, wherein said digitizing steps are interleaved in a manner such that throughput of said analog-to-digital converter is unchanged.

17. The method of claim 12, wherein said successive stages use an additional capacitor array such that said digitizing steps are interleaved in a manner such that throughput of said analog-to-digital converter is unchanged.

18. A method for converting analog signals to digital signals, in a converter, comprising the steps of:
sampling an analog signal in an analog-to-digital converter to produce a sampled signal;
alternately generating a residual signal from said sampled signal and a calibration signal in at least the most significant bit stage of said analog-to-digital converter;
alternately digitizing said residual signal and said calibration signal to obtain digital values in successive stages of said analog-to-digital converter; and
correcting the output of said digitized residual signal with said digital results;
wherein during said sampling step, a substitute capacitor is switched in place of a capacitor generating said calibration signal and said calibration signal represents the capacitor mismatch of a capacitor used to generate said signals and digitization of said residual signal and said calibration signal is interleaved in a manner such that the sample rate of said analog-to-digital converter is maximized.

19. The method of claim 18, wherein said digitizing step utilizes at least one additional array of capacitors for alternately digitizing said residue signal and said calibration signal.

20. The method of claim 18, wherein said sampling step and said calibration signal generation are performed concurrently.

21. The method of claim 18, wherein said first stage utilizes an additional capacitor such that said sampling step and said calibration signal generation are performed concurrently.

22. The method of claim 18, wherein said digitizing step alternates such that the sample rate of said analog-to-digital converter is maximized.

23. An analog-to-digital converter, comprising:
a first stage of an analog-to-digital converter connected to receive and sample an analog input and produce a coarse digital representation of said analog input, a first residue signal, and a first calibration signal which represents the capacitor mismatch of a capacitor used to generate said residue signal; and
one or more subsequent stages of said analog-to-digital converter, connected to receive a residue signal and a calibration signal from an immediately preceding stage and produce coarse digital representations of said residue signal and said calibration signal and successive residue and calibration signals;
wherein said first stage production of said residue signal and said calibration signal is interleaved such that the throughput of said analog-to-digital converter is not decreased.

24. The converter of claim 23, wherein said converter is a pipelined analog-to-digital converter.

25. The converter of claim 23, wherein said first calibration signal is produced while said first stage is sampling said input signal.

26. The converter of claim 23, wherein said first stage further comprises a substitute capacitor to facilitate calibration.

27. The converter of claim 23, wherein said first stage further comprises a dedicated feedback capacitor.

28. The converter of claim 23, wherein in said successive stages production of said coarse digital representations is such that throughput of said analog-to-digital converter is not decreased.

29. The converter of claim 23, wherein said successive stages further comprise an additional capacitor array to facilitate calibration without decreasing the throughput of said analog-to-digital converter.

30. The converter of claim 23, further comprising digital correction logic connected to receive said coarse digital representations and produce a digital output.

31. The converter of claim 23, wherein a capacitor used to generate said first residual signal is used to generate said first calibration signal while said first stage samples said analog input.

* * * * *